United States Patent [19]
Takahashi et al.

[11] Patent Number: 5,610,449
[45] Date of Patent: Mar. 11, 1997

[54] ELECTRIC POWER UNIT

[75] Inventors: Tadashi Takahashi, Hitachi; Akihiko Kanouda, Hitachinaka; Kazuhiro Takizawa; Tetsunosuke Nakamura, both of Yokohama; Masami Joraku, Ibaraki, all of Japan

[73] Assignees: Hitachi, Ltd., Tokyo; Hitachi Media Electronics Co., Ltd., Iwate, both of Japan

[21] Appl. No.: 517,926

[22] Filed: Aug. 22, 1995

[30] Foreign Application Priority Data

Aug. 31, 1994 [JP] Japan ................................. 6-206338

[51] Int. Cl.$^6$ ................................................... H02J 3/12
[52] U.S. Cl. ............................. 307/43; 395/282; 395/283; 361/633; 361/636; 361/686; 361/748; 361/749; 361/791
[58] Field of Search ............................... 307/43; 395/283, 395/282; 361/633, 636, 663, 686, 748, 777, 728, 737, 791; 326/30

[56] References Cited

U.S. PATENT DOCUMENTS

| | | | |
|---|---|---|---|
| 5,272,584 | 12/1993 | Austruy et al. | 361/58 |
| 5,383,081 | 1/1995 | Nishikawa | 361/58 |
| 5,473,499 | 12/1995 | Weir | 361/58 |
| 5,502,617 | 3/1996 | Tsukada et al. | 361/686 |
| 5,519,252 | 5/1996 | Soyano et al. | 257/690 |

FOREIGN PATENT DOCUMENTS 6-61072  1/1994  Japan .

OTHER PUBLICATIONS

Thin Type DC/DC Converter using wire Xformer, 25th Annual IEE Power Conf. pp. 1330–1334 Jun. 20, 1994.

Primary Examiner—William M. Shoop, Jr.
Assistant Examiner—Albert W. Paladini
Attorney, Agent, or Firm—Antonelli, Terry, Stout & Kraus, LLP

[57] ABSTRACT

A compact, thin-type, noise-tolerant and highly reliable electric power unit includes an input portion through which a predetermined voltage is applied, a plurality of power circuits for generating a plurality of different voltages from the predetermined voltage applied to said input portion, an output portion for outputting the plurality of different voltages generated in the plurality of power circuits, a control unit having a function to stabilize the plurality of different output voltages, and an insulated substrate which supports the input portion, the plurality of power circuits, the output portion and the control unit, and further has a printed wiring pattern for electrically coupling the constituent components of the electric power unit. By disposing each group of components which compose each of plurality of power circuits into a predetermined area corresponding to each output voltage, or by arranging the components such that the height of each of the plurality of constituent components for the power circuits is adapted to become approximately the same as or less than the height of the transformer, a compact and thin-type elective power unit which is noise-tolerant and highly reliable is achieved.

7 Claims, 3 Drawing Sheets

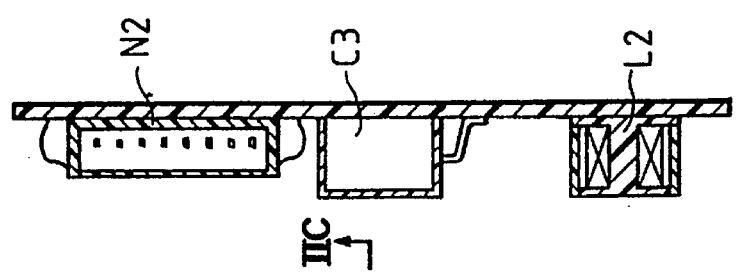
FIG. 2(A)
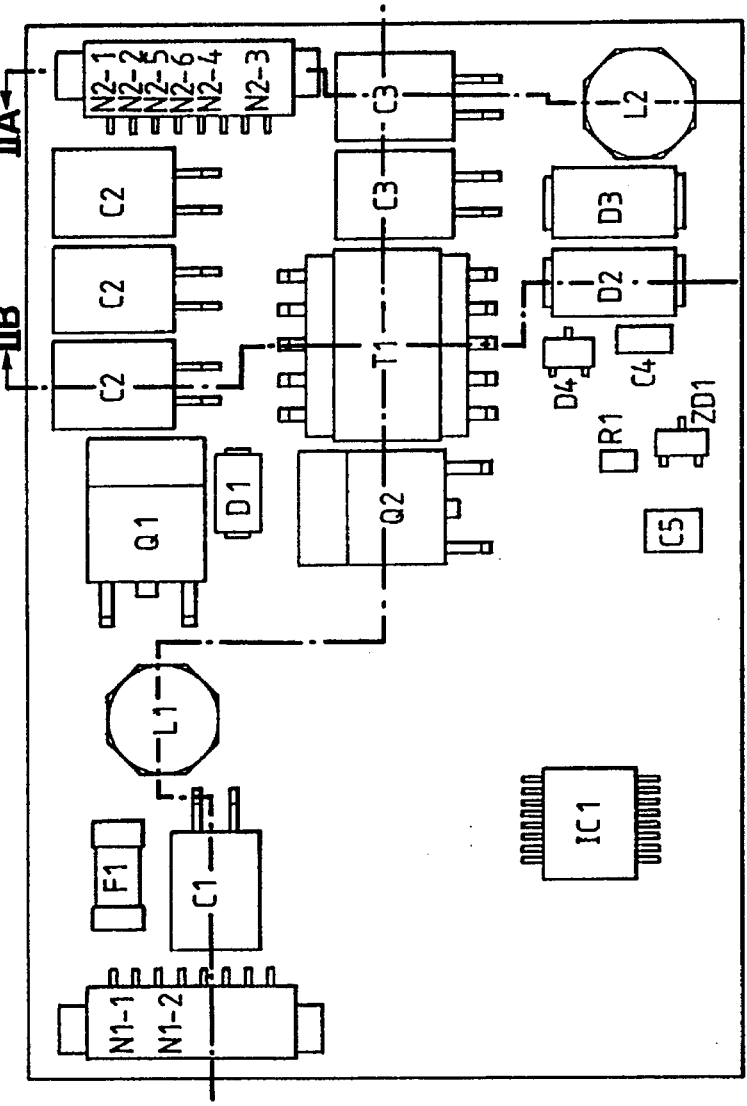
FIG. 2(D)
FIG. 2(B)
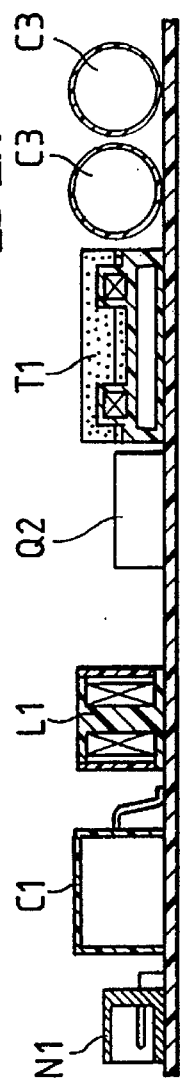
FIG. 2(C)

5,610,449

1

ELECTRIC POWER UNIT

BACKGROUND OF THE INVENTION

The present invention relates to an electric power unit, and in particular, it relates to a thin and compact type electric power unit which is suitable for obtaining a plurality of different output voltages.

To describe a related art electric power units which can output a plurality of output voltages from a single input voltage, we have presented a paper entitled "Thin Type DC/DC Converter Using a Coreless Wire Transformer" which appears in the 25th Annual IEEE Power Electronics Specialists Conference PCSC'94 Record Volume II, pp1330–1334, in which components, such as a switch S1, capacitor C7 and resistance R1, constituting a circuit for one of the respective output voltages are placed together in the center of the power unit apart from those parts constituting a circuit for another output voltage, which are on the left side. However, other components, such as coil L1 and switch S2 are placed therebetween, thereby, creating a likelihood magnetic interference or malfunction due to noise.

Another related electric power unit is disclosed in JP-A Laid-Open No. 6-61072 wherein, we also proposed a thin type transformer and an information processing unit using that transformer, which is directly related to the type of electric power unit capable of outputting a plurality of voltages.

In the foregoing electric power units, however, since the components of the power circuit and the main circuit are not separated definitely in their arrangements, and also, since the control circuit thereof is not definitely separated from the main circuit, their wiring patterns become very complicated and interlaced or crossed, making it impossible to reduce the length of the wiring patterns. As a result, it is difficult to provide a more compact and thinner type electric power unit. Further, since the wiring pattern cannot be broadened, a large loss resulting from a voltage drop due to the wiring resistance occurs, and since noise is readily generated or the unit is often subjected to noise, it has been difficult to provide a highly reliable electric power unit.

SUMMARY OF THE INVENTION

The present invention has been designed to solve the above-mentioned problems associated with prior electric power units. The main object of the invention is to provide a highly reliable, more compact and thinner type electric power unit, which is also noise-tolerant.

The aforementioned object of the invention has been implemented by providing an improved electric power unit having an input portion through which is applied a predetermined voltage from outside; a plurality of power circuits which generate a plurality of different voltages from the predetermined voltage applied to the input portion; an output portion which outputs the plurality of different voltages generated in the plurality of power circuits; a control unit having a function to stabilize these output voltages; and an insulated substrate for supporting the aforementioned input portion, power circuits, output portion and control unit, and having a printed pattern thereon for electrically coupling these components, wherein the improvement comprises: disposing respective components which compose each of the plurality of power circuits in a group in each predetermined area allocated to each output voltage; or restricting each dimension in height of the plurality of constituent components for respective power circuits to approximately the height of a transformer or less.

Disposition areas for respective units of the plurality of power circuits are grouped according to respective output voltages, while a control unit for respective power circuits is disposed together in one area so that the wiring pattern has been substantially simplified; as a result, a more compact design has been realized thereby providing more space for arrangements of components and parts, so as to permit any component which has a large dimension in height to be disposed laterally on its side, in consequence, realizing a thinner type design thereof. Further, for the same dimensions, since the wiring pattern can be broadened to have a wider pattern, the voltage drop across the wiring can be reduced, thereby minimizing the occurrence of noise and adverse effects due to the noise. Still further, by separately grouping the main circuit in which a large current flows and the control unit in which a small current signal flows, it is possible for any adverse effect due to the noise to be substantially eliminated.

BRIEF DESCRIPTION OF THE DRAWINGS

The above and other features and advantages of the invention will be more clearly understood from the following detailed description when taken with reference to the accompanying drawings, wherein:

FIG. 2(A), 2(B) and 2(C) are cross-sectional views of the electric power unit of FIG. 2(D) taken along respective lines IIA—IIA, IIB—IIB and IIC—IIC in FIG. 2(D)

PREFERRED EMBODIMENT

One preferred embodiment of the invention will be described with detail in reference to FIGS. 1 to 3.

Figure 1:
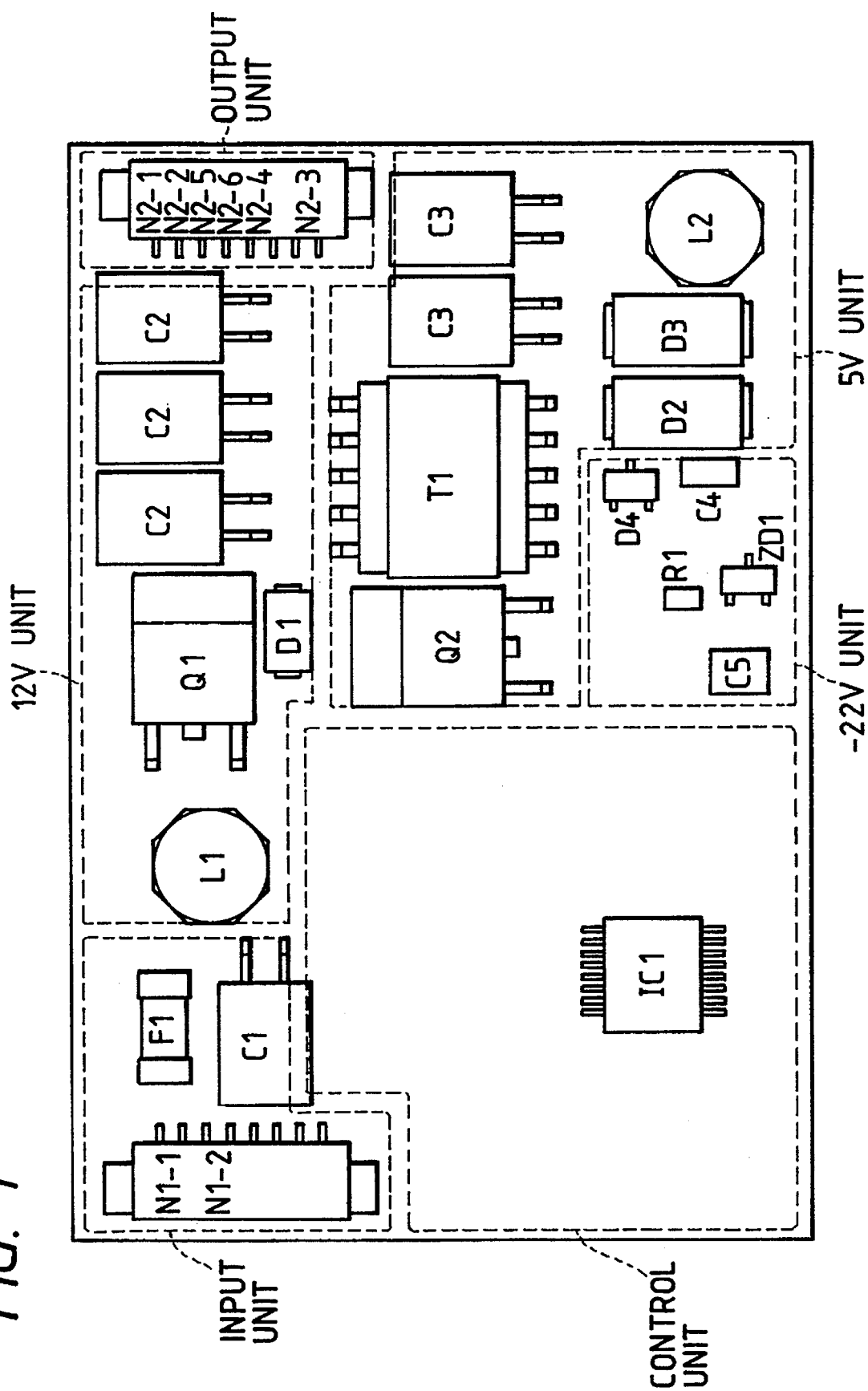
FIG. 1 is a schematic diagram illustrative of an arrangement of components and parts for an electric power unit forming one embodiment of the invention.

FIG. 1 is a plan view indicative of an arrangement of constituent components and parts for an electric power unit according to the invention. FIGS. 2(A) to 2(C) are cross-sectional views indicative of respective cross-sections in FIG. 2(D) of the components in FIG. 1, taken along respective lines in FIG. 2(D). FIG. 3 indicates electric connection of these components and parts.

Figure 3:
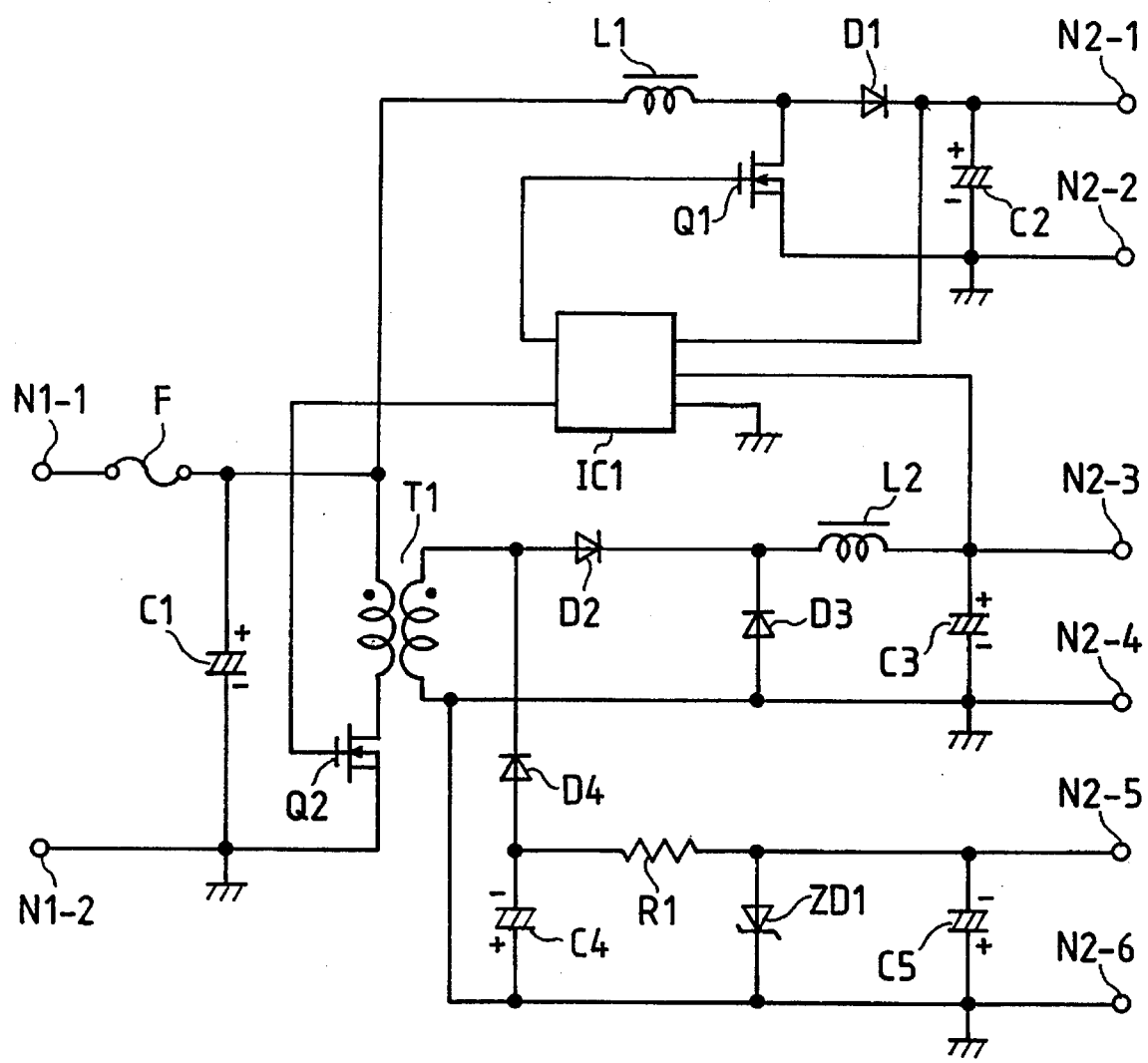
FIG. 3 is a schematic circuit diagram indicative of electrical connections of the electric power unit of one embodiment of the invention.

Before going into the description of these components and parts, we will discuss the electric connections therebetween with reference to FIG. 3.

FIG. 3 shows an equivalent circuit of a power source for obtaining a 5 V source for a control circuit, a 12 V source for supplying a backlight for use in an LCD display, and a −22 V source for driving a printing machine.

In this equivalent circuit, a first output (5 V) and a second output (−22 V) are shown to be obtained through the use of a common transformer, and a third output (12 V) is shown to be obtained through a booster chopper.

In FIG. 3, input terminals N1-1, N1-2 are adapted to receive a DC voltage of 9 V which is either stepped-down from the commercial power supply by means of an AC adapter or is supplied from a battery. To the positive side N1-1 of these input terminals are coupled via fuse F a positive side of capacitor C1 and one end of transformer T1, and in addition, to one end of coil L1. To the other end of the primary winding of the transformer T1 is coupled the drain of a switching element Q2. The source of the switching element Q2 and the negative side of input capacitor C1 are coupled to the negative side N1-2 input terminals.

One end of the secondary winding of transformer T1 is coupled to the anode side of a first output rectifier diode D2 and to the cathode side of a second output rectifier diode D4. The other end of the secondary winding of the transformer T1 is coupled to the negative side N2-4 of the first output terminal and to the positive side N2-6 of the second output terminal, respectively. The cathode side of the diode D2 is coupled to the cathode side of rectifier diode D3 and to one end of coil L2 as well. The other end of the coil L2 is coupled to the positive side of smoothening capacitor C3 and to a positive side N2-3 of the first output terminal. The anode side of diode D3 and the negative side of smoothening capacitor C3 are coupled to the negative side N2-4 of the first output terminal.

The anode side of diode D4 is coupled to the negative side of capacitor C4 as well as to one end of resistance R1. The other end of resistance R1 is coupled to the anode side of voltage regulation diode ZD1, the negative side of capacitor C5 and a negative side N2-5 of the second output terminal.

Positive sides of capacitors C4 and C5, and the cathode side of the voltage regulation diode ZD1 are coupled to the positive side N2-6 of the second output terminal.

The other end of coil L1 in the circuit for obtaining the third output voltage is coupled to the drain of switching element Q1 and to the anode side of rectifier diode D1. The cathode side of the rectifier diode D1 is coupled to a positive side N2-1 of the third output terminal as well as to the positive side of capacitor C2.

The source of switching element Q1 and the negative side of capacitor C2 are coupled to the negative side N2-2 of the third output terminal.

Further, the negative side N2-4 of the first output terminal, the positive side N2-6 of the second output, the negative side N2-2 of the third output terminal and the negative side N1-2 of the input are coupled together and grounded.

Further, input terminals of the control IC circuit IC1 are coupled to the first output terminal and the third output terminal, respectively. Outputs from the control IC circuit IC1 are coupled to the gates of the switching elements Q1 and Q2, respectively. The control IC circuit IC1 is a commercially available switching voltage control IC including a pair of pulse width modulation (PWM) control circuits.

The preferred embodiment of the invention has the circuit configuration as described above and is adapted to operate as follows.

To begin with, we will explain a converter for obtaining the first output (5 V). When the switching element Q2 is turned on, a current flows from the positive side N1-1 from the direct current source via the fuse F to the primary winding of transformer T1, switching element Q2 and to the negative side N1-2 of the direct current source. This current passing through the primary winding induces a voltage across the secondary winding of transformer T1. This induced voltage is rectified by diode D2 and is smoothed by coil L2 and capacitor C3.

When the switching element Q2 is turned OFF, excitation energy stored in coil L2 is consumed to charge capacitor C3 through diode D3. In the manner as stated above, the first output of 5 V is obtained across the terminals N2-3 and N2-4.

Further, in order to stabilize the first output voltage, an output value of the first output voltage is taken into the control IC circuit IC1 such that when its value is higher than a reference value of the first output voltage, the on-duty time of the switching element is lowered, and when its value is lower than the reference value thereof, the on-duty time thereof is raised so as to maintain a constant output voltage.

Next, we will describe a converter for obtaining the second output (−22 V), and how it is operated.

When the switching element Q2 is turned ON, energy is transferred to the secondary side of transformer T1, and at the same time, excitation energy is stored in the transformer T1. Then, when the switching element Q2 is turned OFF, the excitation energy having been stored in the transformer T1 will flow through diode D4 to charge capacitor C4 to assume respective polarities as indicated in the drawing of FIG. 3.

This voltage is stabilized by resistance R1 and reference voltage diode ZD1 to become a constant voltage then to be stored in capacitor C5, which produces the second output of −22 across terminals N2-5 and N2-6.

The third output (12 V) has a so-called stepped-up chopper circuit configuration. When switching element Q1 is turned-on, a current flows from the positive side N1-1 from the DC power source via fuse F to coil L1, switching element Q1 and to the negative side N1-2 of the DC power source. Excitation energy due to this current is stored in coil L1.

When the switching element Q1 is turned off, a voltage which is a sum of the voltage generated by the excitation energy and stored in coil L1, and the voltage from the DC power source is adapted to charge capacitor C2 through diode D1. In the manner as described above, the third output voltage of 12 V is obtained across terminals N2-1 and N2-2.

Further, in order to obtain a stable third output voltage, part of this output voltage is taken into the control IC circuit IC1. When the output voltage is higher than a reference value for the third output voltage, the on-duty time of switching element Q1 is lowered, while when it is lower than the reference value, the on-duty time thereof is increased so as to appropriately adjust the excitation energy to be stored in coil L1 thereby to maintain its output voltage at a constant value.

By way of example, in the power circuits of FIG. 3, 5 V is obtained as the first output, −22 V is obtained as the second output, and 12 V is obtained as the third output, respectively. This type of electric power unit will be most suitable for use in a portable information machine operating on a battery.

An example of preferred arrangements of components and parts composing such power circuits for providing a plurality of power sources is illustrated in FIG. 1.

FIG. 1 indicates an example of the arrangement of components on a printed board, insulated metal substrate or the like according to the invention.

In the drawing of FIG. 1, the input portion includes an eight pin a connector providing input terminals including terminals N1-1 and N1-2, a fuse F1, and a capacitor C1, each coupled as shown in FIG. 3.

The 5 V power circuit portion comprises a switching element Q2 having three terminals, a transformer T1 having ten terminals, diodes D2 and D3, a coil L2, and a capacitor C3 provided as a pair of two blocks, wherein respective components are coupled to each other as indicated in FIG. 3. Further, as shown in FIG. 1, these components and parts are grouped and disposed in the bottom portion directly below the output portion and the 12 V portion. Further, in order to limit the height of capacitor C3 as much as possible, the capacitor C3 is divided into two blocks as shown in the drawing; however, it is not limited thereto, but may be divided into any number of blocks.

The packaging thickness obtained by mounting the capacitor C3, coil L2 and transformer T1 on the insulating substrate is set approximately at 5 millimeters. This is because that, since the normal thickness of a packaged control substrate having a power IC and logic circuits is approximately 5 millimeters, by conforming to this thickness, the electric power unit of the invention can be used, while being placed next to the control substrate in the case body of any information device or the like, thereby suppressing further increase in the height of the information device. If the height of the electric power unit exceeds the height of the control substrate, the height of the information device will increase accordingly, thereby failing to provide a thin type information device as required by the invention.

By way of example, the aforementioned transformer comprises 5 coils, three coils of which are coupled in parallel connection to form a primary winding, while the remaining two coils are coupled in series connection to form a secondary winding. Thus, ten terminals for the five coils in the transformer are coupled to form the primary and the secondary windings in the manner described above. That is, since respective coils each have two terminals, the transformer T1 is provided with ten terminals.

Further, the aforementioned coil L2 is disposed as far as possible from coil L1 of the third power circuit so that the coil L2 is not likely to be magnetically affected by the coil L1.

The −22 V power circuit for obtaining the second power supply of −22 V comprises switching element Q2 and transformer T1, use of these two components is shared by the 5 V power supply, and further it includes diode D4, capacitor C4, resistance R1, constant voltage diode ZD1, and capacitor C5, all of which are coupled with each other as shown in FIG. 3 and are juxtaposed to the 5 V power supply.

The third power circuit for obtaining 12 V power supply comprises switching element Q1, coil L1, diode D1 and capacitor C2, which are coupled with each other as shown in FIG. 3, and are disposed collectively within dotted lines between the input portion and the output portion. The capacitor C2 is divided into three sub-blocks in order to reduce the total height of the electric power unit, but it is not limited thereto, and may be divided into any number of sub-blocks so that the height thereof may not exceed the height of any other component which cannot be divided.

Further, the aforementioned coil L1 is disposed as far as possible from the coil L2 of the first power circuit so that it is least affected magnetically from the coil L2. These coils L1 and L2 disposed farthest from each other will not electro-magnetically interact with each other.

In the same way as the preceding case, the height of the packaging with the capacitor C2 on the insulated substrate is arranged to be approximately 5 millimeters, which is the lamination thickness of transformer T1 and the insulation substrate.

The control unit portion which includes control IC circuit IC1 and its peripheral circuits is juxtaposed to the first output portion through the third output portion respectively indicated in FIG. 1, thereby minimizing respective wiring therebetween. Further, the minimized wiring thus realized helps to reduce electrical noise and its resultant adverse effect, thereby preventing malfunction due to the noise.

The output portion is provided with a connector having 8 pins similar to the input portion, whereby the first power supply is output from output terminals N2-3 and N2-4, the second power supply is output from output terminals N2-5 and N2-6, and the third power supply is output from output terminals N2-1 and N2-2.

The electric power unit mounted on a square-shaped insulated substrate composed of epoxy resin or the like is obtained by arranging unit in the order of the input portion, the third power circuit and then the output portion along a longitudinal side of the insulation substrate, and further arranging units in the order of the control unit, the first power circuit and the second power circuit along the other longitudinal side of the insulation substrate, wherein part of the first power circuit is interposed between the third power circuit and the second power circuit in the vertical direction on the surface of the substrate.

Cross-sectional configurations of the electric power unit having parts and components arranged as above will be described with reference to FIGS. 2(A) to 2(D). In the drawing, three aspects of cross-sectional views of the parts and components along lines IIA-IIB,IIB—IIB and IIC—IIC in FIG. 2(D) are shown in FIGS. 2(A) to 2(C), respectively.

The cross-section shown in FIG. 2(A) is a cross-sectional view through the output connector N2, capacitor C3 and coil L2.

As is obvious from the drawing, components such as the connector N2, capacitor C3 and the like in the output portion preferably have approximately the same dimension in height as or less than that of transformer T1 and coils L1, L2. In particular, as to capacitor C3, it is divided into a plurality of constituent blocks so as to decrease the total height thereof whereby a flattened coil C3 can be provided. Further, as to this capacitor, a square cylindrical type capacitor is employed which is mounted laterally to suppress any increase in the height.

The cross-section shown in FIG. 2(B) is a cross-sectional view through capacitor C2, transformer T1 and diode D2.

In this case, also, the capacitor C2 is divided into a plurality of constituent blocks to reduce the total height such that each block has approximately the same height as the transformer T1 or the coil, thereby advantageously reducing the total thickness of the electric power unit.

The cross-section shown in FIG. 2(C) is a cross-sectional view through connector N1, capacitor C1, coil L1, switching element Q2, transformer T1, and capacitor C3 divided into two constituent blocks. As can be learned readily from the drawing, respective dimensions in height of respective components are adapted to have substantially the same value as or less than the height of a component such as transformer T1 or coil L1, which cannot be divided any further, in order to reduce the total height of the electric power unit. Namely, any particular component the height of which is substantially higher than most of the other components is divided into constituent blocks to reduce its height approximately to the height of or less than the height of the transformer and other components which cannot be divided still further.

According to the concept and steps of the invention, a compact, card type electric power unit has been fabricated which is capable of outputting 10 W and has a size of about 60–70 millimeter length at a long side, about 40 millimeter length at a short side, 5 millimeters in height, and has a substantially smaller surface area than a telephone card of a normal size. This size is almost half the size of any prior art electric power unit known heretofore, and in addition, its weight is reduced to approximately 10 grams. This size can be made smaller if desired and more compact and high performance advanced components can be used, although its production cost will soar. On the other hand, it makes little sense in practice to make the total thickness of the electric power unit significantly thinner than a thickness of control substrate of the normal size, and therefore, the above-mentioned preferred height has been chosen.

Since respective components and parts for constituting respective power circuits have been arranged in respective groups corresponding to respective output voltages, as described above, it is possible to prevent respective wiring patterns of the plural power circuits from interlacing or crossing one another, that is, the total wiring pattern can be substantially simplified. In addition, in view of the total arrangements, since respective groups of the aforementioned plural power circuits are disposed in juxtaposition with the control unit, which is typified by control IC (IC1), respective lengths of wiring patterns for coupling between the control unit and the respective power circuits can be reduced to a minimum, thereby minimizing the total length of the printed wiring pattern for transmitting data therebetween. As a result, the surface area of the substrate can be minimized. On the other hand, when a further reduction in the surface area is not necessarily required, an additional spatial margin can be retained on the substrate to place laterally other components and parts than those recited above which have a high elevation, thereby facilitating a further reduction in thickness. By way of example of this preferred embodiment of the invention, the capacitors may be actually placed on their sides to prevent any increase in the height or thickness. Further, since the wiring width can be broadened due to the additional spatial margin, the voltage drop across wiring can be minimized, thereby preventing the occurrence of noise and thus an adverse effect due to noise.

Further, since the coils in the power circuits will generally produce electromagnetic noise, an interference due to the electromagnetic noise is likely to be generated, in particular, between the first power circuit which outputs 5 V and the third power circuit which outputs 12 V. However, in the one preferred embodiment of the invention described above, coil L2 of the first power circuit and coil L1 of the third power circuit are arranged to be separated as much as possible to prevent such magnetic interference from occurring. Namely, the coil L1 is disposed at a position farthest from the first power circuit, and the coil L2 is disposed at a position farthest from the third power circuit.

By way of example, use of a tantalum electrolytic capacitor will eliminate a hazard of fire and thereby will improve product safety.

According to the invention, as has been described above, there has been provided a compact, thin-type, noise-tolerant, highly reliable electric power unit which comprises an the input portion for applying a predetermined voltage from outside; a plurality of power circuits for generating the plurality of different voltages from a predetermined input voltage applied to the input portion; an output portion for outputting the plurality of output voltages generated in a plurality of power circuits; the control portion having a function to stabilize the plurality of different output voltages; and an insulated substrate which supports the input portion, the plurality of power circuits, the output portion and the control portion, and further has printed wiring patterns for electrically coupling the constituent components and parts for the electric power unit. The electric power unit is further characterized in that each group of components and parts which compose each of the plurality of power circuits corresponding to each output voltage is disposed in a predetermined area allocated to each output voltage, or the height of each of plurality of components and parts which compose the power circuits is adapted to become approximately identical with or to not exceed the size of the transformer in the direction perpendicular to the surface of the insulated substrate.

What is claimed is:

1. An electric power unit comprising:

an input portion through which a predetermined voltage is applied, a plurality of power circuits for generating a plurality of different voltages from said predetermined voltage applied to said input portion, an output portion for outputting said plurality of different voltages generated in said plurality of power circuits, a control unit having a function to stabilize said plurality of different output voltages and an insulated substrate which supports said input portion, said plurality of power circuits, said output portion and said control unit, and which further has a printed wiring pattern thereon for electrically coupling constituent components and parts of the electric power unit, wherein each of the components and parts which composes each of said plurality of power circuits is disposed on said substrate in a predetermined respective area corresponding to each of said plurality of different output voltages to be generated.

2. The electric power unit according to claim 1, wherein a predetermined one of said plurality of power circuits has said input portion disposed on one side thereof and said output portion disposed on the opposite side thereof.

3. The electric power unit according to claim 1, wherein each of said plurality of power circuits is juxtaposed to said control unit.

4. The electric power unit according to claim 1, wherein at least two power circuits of said plurality of power circuits are provided with a coil, wherein one coil in one of said at least two power circuits is disposed within its power circuit area as far as possible from the other one of said at least two power circuits and the other coil in the other one of said at least two power circuits is disposed within its power circuit area as far as possible from said one of said at least two power circuits.

5. An electric power unit comprising: an input portion through which a predetermined voltage is applied, a plurality of power circuits for generating a plurality of different voltages from said predetermined voltage applied to said input portion, an output portion for outputting said plurality of different voltages generated in said plurality of power circuits, a control unit having a function to stabilize said plurality of different output voltages, and an insulated substrate which supports said input portion, said plurality of power circuits, said output portion and said control unit, and which further has a printed wiring pattern thereon for electrically coupling constituent components and parts of the electric power unit, at least one of said plurality of power circuits including a transformer, wherein the dimension in height of said plurality of constituent components for said plurality of power circuits is adapted to be approximately the same as or less than the height of said transformer.

6. An electric power unit comprising:

an input portion through which a predetermined voltage is applied, a plurality of power circuits for generating a plurality of different voltages from said predetermined voltage applied to said input portion, an output portion for outputting said plurality of different voltages generated in said plurality of power circuits, a control unit having a function to stabilize said plurality of different output voltages, and an insulated substrate which supports said input portion, said plurality of power circuits, said output portion and said control unit, and which further has a printed wiring pattern thereon for electrically coupling constituent components and parts of the electric power unit, at least one of said plurality of power circuits including a transformer, wherein a capacitor in combination with other components forms a given power circuit, said capacitor being subdivided into a plurality of portions such that the height of each of said plurality of subdivided portions is approximately the same as or less than the height of said transformer.

7. An electric power unit comprising:

an input portion through which a predetermined voltage is applied from external, a plurality of power circuits for generating a plurality of different voltages from said predetermined voltage applied to said input portion, an output portion for outputting said plurality of different voltages generated in said plurality of power circuits, a control unit having a function to stabilize said plurality of different output voltages, and an insulated substrate which supports said input portion, said plurality of power circuits, said output portion and said control unit, and which further has a printed wiring pattern thereon for electrically coupling constituent components and parts of the electric power unit, wherein each of the components of said plurality of power circuits has a maximum dimension of 5 millimeters or less in the vertical direction from the surface of said insulated substrate.

* * * * *